(12) United States Patent
Nishiguchi

(10) Patent No.: US 11,018,251 B2
(45) Date of Patent: May 25, 2021

(54) SEMICONDUCTOR DEVICE

(71) Applicants: Kabushiki Kaisha Toshiba, Tokyo (JP); Toshiba Electronic Devices & Storage Corporation, Tokyo (JP)

(72) Inventor: Toshifumi Nishiguchi, Hakusan Ishikawa (JP)

(73) Assignees: Kabushiki Kaisha Toshiba, Tokyo (JP); Toshiba Electronic Devices & Storage Corporation, Tokyo (JP)

( * ) Notice: Subject to any disclaimer, the term of this patent is extended or adjusted under 35 U.S.C. 154(b) by 0 days.

(21) Appl. No.: 16/543,942

(22) Filed: Aug. 19, 2019

(65) Prior Publication Data

US 2020/0259015 A1     Aug. 13, 2020

(30) Foreign Application Priority Data

Feb. 8, 2019 (JP) .............................. JP2019-021248

(51) Int. Cl.
*H01L 29/78* (2006.01)
*H01L 29/10* (2006.01)
(Continued)

(52) U.S. Cl.
CPC ...... *H01L 29/7813* (2013.01); *H01L 29/0696* (2013.01); *H01L 29/0865* (2013.01);
(Continued)

(58) Field of Classification Search
CPC ........... H01L 29/7813; H01L 29/41741; H01L 29/4236; H01L 29/407; H01L 29/404; H01L 29/7811; H01L 29/4238
See application file for complete search history.

(56) References Cited

U.S. PATENT DOCUMENTS 6,337,498 B1   1/2002 Hasegawa et al.
2016/0079375 A1*  3/2016 Yamazaki ........... H01L 29/4238
                                                    257/330
(Continued)

FOREIGN PATENT DOCUMENTS

JP      3410949 B2   5/2003
JP      3455414 B2   10/2003
(Continued)

*Primary Examiner* — Syed I Gheyas
(74) *Attorney, Agent, or Firm* — White & Case LLP

(57) ABSTRACT

A semiconductor device includes a semiconductor body; first and second electrodes provided on back and front surfaces of the semiconductor body, respectively; a third electrode provided on the front surface; and a control electrode disposed inside a trench on the front surface side, and electrically connected to the third electrode. The third electrode is electrically insulated from the semiconductor body and the second electrode. The control electrode is placed between the semiconductor body and the second electrode, and is electrically insulated from the semiconductor body and the second electrode. The control electrode continuously extends inside the trench without branching. The control electrode includes first and second portions. The first portion extends in a first direction parallel to the front surface of the semiconductor body, and the second portion extends in a second direction parallel to the front surface of the semiconductor body and crossing the first direction.

5 Claims, 7 Drawing Sheets

(51) Int. Cl.
- *H01L 29/417* (2006.01)
- *H01L 29/423* (2006.01)
- *H01L 29/40* (2006.01)
- *H01L 29/08* (2006.01)
- *H01L 29/06* (2006.01)

(52) U.S. Cl.
CPC ...... *H01L 29/0882* (2013.01); *H01L 29/1095* (2013.01); *H01L 29/404* (2013.01); *H01L 29/407* (2013.01); *H01L 29/41741* (2013.01); *H01L 29/4236* (2013.01); *H01L 29/4238* (2013.01); *H01L 29/7811* (2013.01)

(56) References Cited

U.S. PATENT DOCUMENTS

2016/0380047 A1* 12/2016 Hara .................. H01L 29/4238
257/409
2017/0018636 A1    1/2017 Naito

FOREIGN PATENT DOCUMENTS

| JP | 5011843 B2 | 8/2012 |
| JP | 2017-28244 A | 2/2017 |

\* cited by examiner

SEMICONDUCTOR DEVICE

CROSS-REFERENCE TO RELATED APPLICATIONS

This application is based upon and claims the benefit of priority from Japanese Patent Application No. 2019-021248, filed on Feb. 8, 2019; the entire contents of which are incorporated herein by reference.

FIELD

Embodiments relate to a semiconductor device.

BACKGROUND

A power control semiconductor device is required to have a low ON-resistance so as to reduce the power loss. For example, in a trench-gate MOSFET, the ON-resistance can be reduced by increasing the density of the trench gates in the active region through which the ON-current flows. However, materials provided in the trench gate such as a poly-silicon electrode, a gate insulating film, a field plate insulating film and the like may cause large warp in the wafer processed through the manufacturing processes due to differences in the thermal expansion coefficients thereof, and thus, the manufacturing efficiency may be decreased.

DETAILED DESCRIPTION

Figure 1A:
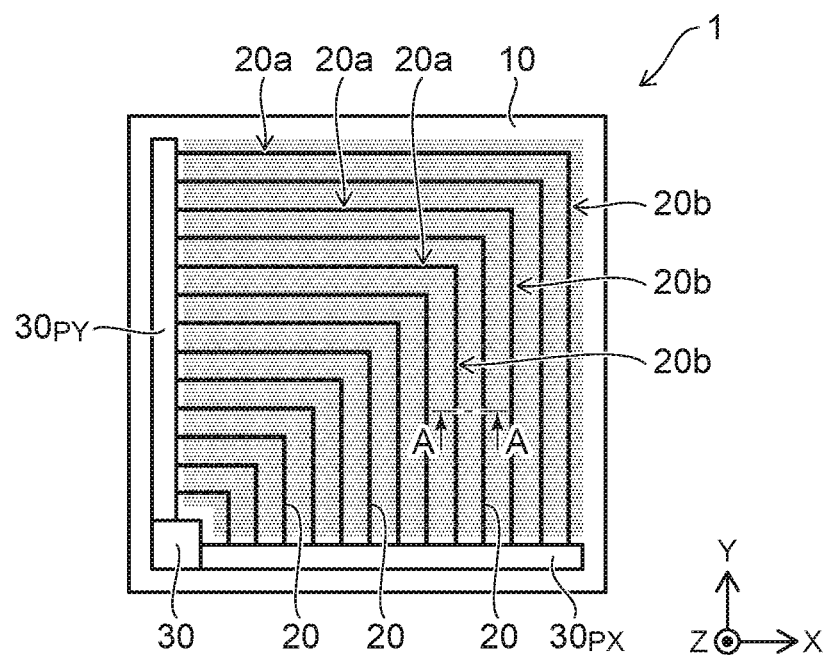
FIGS. 1A and 1B are schematic views showing a semiconductor device according to an embodiment.

According to one embodiment, a semiconductor device includes a semiconductor body, a first electrode provided on a back surface of the semiconductor body, a second electrode provided on a front surface side of the semiconductor body, a third electrode provided on the front surface side of the semiconductor body, and a control electrode disposed inside a trench on the front surface side of the semiconductor body. The third electrode is electrically insulated from the semiconductor body and the second electrode. The control electrode is placed between the semiconductor body and the second electrode. The control electrode is electrically connected to the third electrode. The control electrode is electrically insulated from the semiconductor body by a first insulating film, and electrically insulated from the second electrode by a second insulating film. The semiconductor body includes a first semiconductor layer of a first conductivity type, a second semiconductor layer of a second conductivity type and a third semiconductor layer of the first conductivity type. The second semiconductor layer is provided between the first semiconductor layer and the second electrode. The second semiconductor layer opposes the control electrode with the first insulating film interposed. The third semiconductor layer is selectively provided between the second semiconductor layer and the second electrode. The third semiconductor layer is electrically connected to the second electrode. The control electrode continuously extends inside the trench without branching. The control electrode includes a first portion and a second portion. The first portion extends in a first direction parallel to the front surface of the semiconductor body, and the second portion extends in a second direction parallel to the front surface of the semiconductor body, the second direction crossing the first direction.

Embodiments will now be described with reference to the drawings. The same portions inside the drawings are marked with the same numerals; a detailed description is omitted as appropriate; and the different portions are described. The drawings are schematic or conceptual; and the relationships between the thicknesses and widths of portions, the proportions of sizes between portions, etc., are not necessarily the same as the actual values thereof. The dimensions and/or the proportions may be illustrated differently between the drawings, even in the case where the same portion is illustrated.

There are cases where the dispositions of the components are described using the directions of XYZ axes shown in the drawings. The X-axis, the Y-axis, and the Z-axis are orthogonal to each other. Hereinbelow, the directions of the X-axis, the Y-axis, and the Z-axis are described as an X-direction, a Y-direction, and a Z-direction. Also, there are cases where the Z-direction is described as upward and the direction opposite to the Z-direction is described as downward.

Figure 1B:
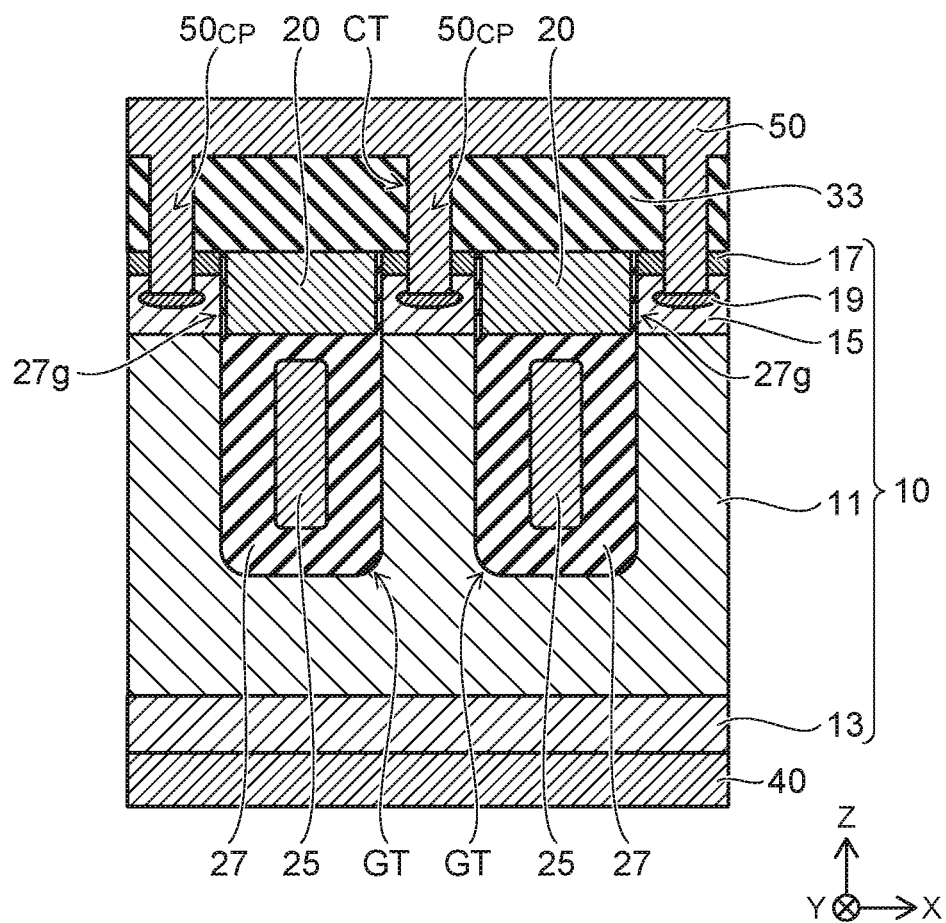

FIGS. 1A and 1B are schematic views showing a semiconductor device 1 according to an embodiment. The semiconductor device 1 is, for example, a power MOSFET having a trench gate structure. For example, the semiconductor device 1 has a MOS (Metal Oxide Semiconductor) structure provided on the front surface side of a semiconductor body 10. The semiconductor body 10 is, for example, silicon. FIG. 1A is a schematic plan view showing the arrangement of a gate electrode 20 and a gate pad 30 of the semiconductor device 1. FIG. 1B is a schematic view showing a cross section along line A-A shown in FIG. 1A.

As shown in FIG. 1A, the gate electrode 20 includes, for example, a first portion 20a and a second portion 20b. The first portion 20a extends in a first direction (e.g., the X-direction) along the front surface of the semiconductor body 10. The second portion 20b is linked to the first portion 20a and extends in a second direction (e.g., the Y-direction) along the front surface of the semiconductor body 10. For example, the first direction crosses the second direction in the front surface of the semiconductor body 10.

The semiconductor body 10 has, for example, four corners along the outer edge of the front surface. The gate pad 30 is placed, for example, at one of the four corners of the semiconductor body 10. The gate pad 30 is connected to gate interconnects $30_{PX}$ and $30_{PY}$ which extend in the X-direction and the Y-direction, respectively, along the outer edge of the front surface of the semiconductor body 10. The gate interconnect $30_{PY}$ is electrically connected to the first portion 20a of the gate electrode 20. The gate interconnect 30$_{PX}$ is electrically connected to the second portion 20b of the gate electrode 20.

The gate electrode 20, for example, is provided in a plurality. The first portions 20a of the multiple gate electrodes 20 are arranged in the Y-direction and electrically connected to the gate interconnect 30$_{PY}$. The second portions 20b of the multiple gate electrodes 20 are arranged in the X-direction and electrically connected to the gate interconnect 30$_{PX}$.

As shown in FIG. 1B, the semiconductor device 1 further includes a drain electrode 40 (a first electrode) and a source electrode 50 (a second electrode). The drain electrode 40 is provided on the back surface of the semiconductor body 10. The source electrode 50 is provided at the front surface side of the semiconductor body 10.

The semiconductor body 10 includes, for example, an n-type drift layer 11 (a first semiconductor layer), an n-type drain layer 13, a p-type diffusion layer 15 (a second semiconductor layer), an n-type source layer 17 (a third semiconductor layer), and a p-type contact layer 19.

The n-type drain layer 13 is provided between the n-type drift layer 11 and the drain electrode 40. The n-type drain layer 13 includes n-type impurities with a higher concentration than the concentration of n-type impurities in the n-type drift layer 11, The drain electrode 40 contacts the n-type drain layer 13 and is electrically connected to the n-type drain layer 13.

The p-type diffusion layer 15 is provided between the n-type drift layer 11 and the source electrode 50. The n-type source layer 17 is selectively provided between the p-type diffusion layer 15 and the source electrode 50. The n-type source layer 17 includes n-type impurities with a higher concentration than the concentration of n-type impurities in the n-type drift layer 11. The n-type source layer 17 is electrically connected to the source electrode 50.

For example, the p-type contact layer 19 is provided in the p-type diffusion layer 15. The p-type contact layer 19 includes p-type impurities with a higher concentration than the concentration of p-type impurities in the p-type diffusion layer 15. The source electrode 50 is electrically connected to the p-type contact layer 19 via a contact portion 50$_{CP}$. The contact portion 50$_{CP}$ extends through an inter-layer insulating film 33 and into the semiconductor body 10.

The contact portion 50$_{CP}$ extends into a contact trench CT that has a depth capable of reaching the p-type contact layer 19 from the front surface of the inter-layer insulating film 33. The contact portion 50$_{CP}$ contacts the p-type contact layer 19. The contact portion 50$_{CP}$ also contacts the n-type source layer 17 exposed at the inner wall of the contact trench CT and is electrically connected to the n-type source layer 17.

As shown in FIG. 1B, the gate electrode 20 is disposed inside a gate trench GT that is provided on the front surface side of the semiconductor body 10. A field plate 25 also is disposed inside the gate trench GT. The field plate 25 is electrically insulated from the gate electrode 20. The gate electrode 20 and the field plate 25 are electrically insulated from the semiconductor body 10 by an insulating film 27. The gate electrode 20 is electrically insulated from the source electrode 50 by the inter-layer insulating film 33. The insulating film 27 and the inter-layer insulating film 33 are, for example, silicon oxide films.

The gate electrode 20 is disposed in the gate trench GT such that the gate electrode 20 and the p-type diffusion layer 15 face each other with a portion 27g of the insulating film 27 interposed. The portion 27g of the insulating film 27 serves as a gate insulating film. For example, the field plate 25 is positioned between the n-type drift layer 11 and the gate electrode 20 in the Z-direction. The field plate 25 extends in the gate trench GT with the gate electrode 20. For example, the field plate 25 is electrically connected to the source electrode 50 at a portion not-illustrated.

As shown in FIG. 1A, the gate electrode 20 according to the embodiment includes the first portion 20a and the second portion 20b, and extends continuously inside the gate trench GT. The semiconductor body 10 and the insulating film 27 that are provided inside the gate trench GT, for example, may generate stress in the wafer due to the difference in the linear thermal expansion coefficients thereof, and it is possible to suppress the stress by providing the first portion 20a and the second portion 20b. Thus, warp of the wafer can be suppressed in the manufacturing processes of the semiconductor device 1.

For example, when including either one of the first portion 20a and the second portion 20b, the warp of the wafer is large along the direction orthogonal to the gate electrode 20. In contrast, by providing both the first portion 20a and the second portion 20b, the surface areas decrease in which the first and second portions 20a and 20b are provided respectively, and thus, the stress is reduced. In such an example shown in FIG. 5B, it is also possible to control the warp amount of the wafer by changing the ratio of the surface areas in which the first portion 20a and the second portion 20b are disposed respectively.

In a trench gate structure in which the field plate 25 is disposed inside the gate trench GT, the gate trench GT is provided deeper in the Z-direction. Thus, the volume of the insulating film 27 provided inside the gate trench GT increases; and the distortion of the wafer becomes large in the manufacturing processes. As a result, the warp of the wafer becomes large. According to the embodiment, although the gate trench GT is formed deeply in the manufacturing processes of the semiconductor device 1, the gate electrode 20 effectively suppresses the warp of the wafer.

Figure 7A:
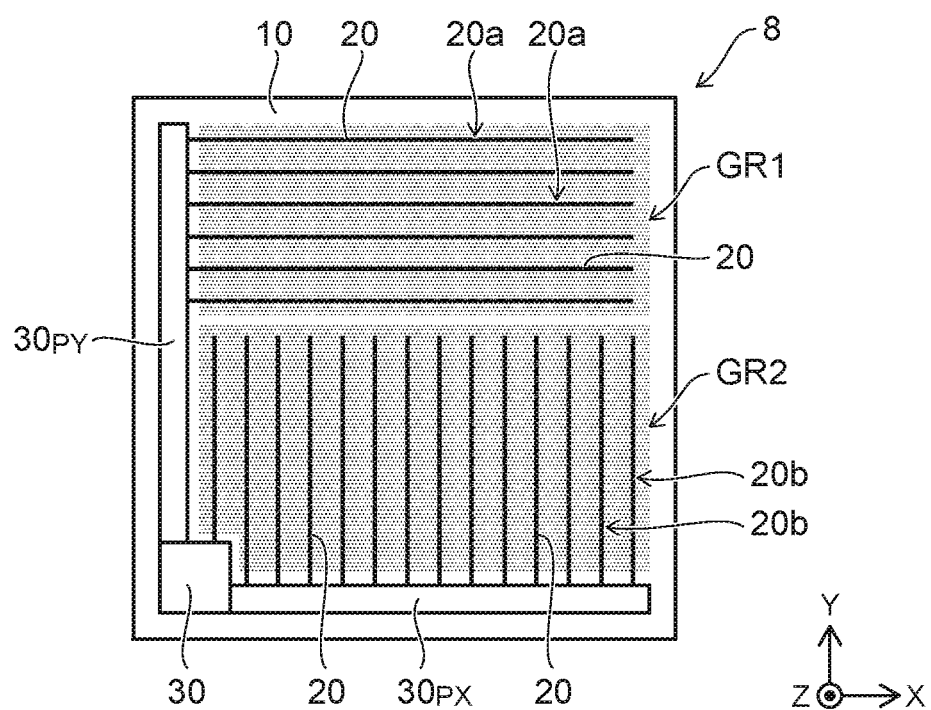
FIGS. 7A and 7B are schematic views showing a semiconductor device according to comparative example.

Moreover, the ON-resistance can be reduced in the semiconductor device 1 according to the embodiment. For example, a semiconductor device 8 shown in FIG. 7A includes the multiple first portions 20a and the multiple second portions 20b provided in the semiconductor body 10. The warp of the wafer may be suppressed thereby in the manufacturing processes of the semiconductor device 8. In the semiconductor device 8, however, the first portions 20a and the second portions 20b are spaced away from each other, and placed in mutually-different regions. In other words, a first region GR1 that includes the multiple first portions 20a and a second region GR2 that includes the multiple second portions 20b are provided. Thus, the portion that does not contribute to the ON-current is provided between the first region GR1 and the second region GR2.

In contrast, by linking the first portion 20a and the second portion 20b of the gate electrode 20, the surface area that contributes to the ON-current can be set to be larger in the semiconductor device 1 according to the embodiment. That is, the ON-resistance of the semiconductor device 1 can be lower than that of the semiconductor device 8.

Figure 7B:
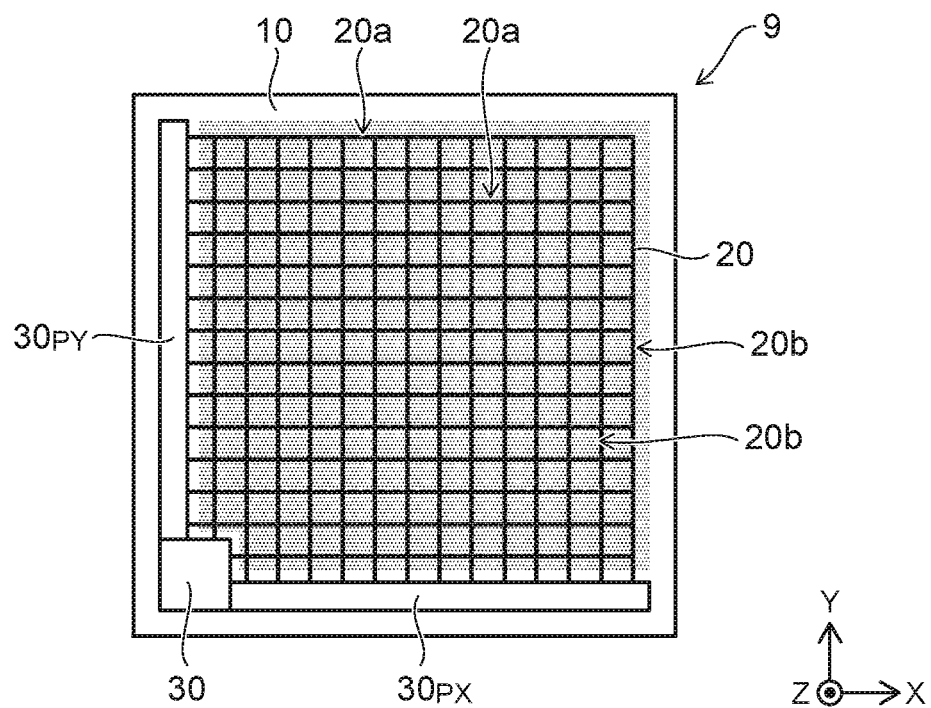

In a semiconductor device 9 shown in FIG. 7B, the multiple first portions 20a and the multiple second portions 20b mutually cross and are arranged into a lattice configuration. The warp of the wafer can be suppressed thereby in the manufacturing processes of the semiconductor device 9. When downscaling the gate trench GT in the semiconductor device 9, however, the surface area of the semiconductor body 10 positioned between the first portions 20a and between the second portions 20b is reduced; and the flow path of the current flowing through the n-type drift layer 11 becomes narrow between the gate electrodes 20. Thus, when the channel resistance is reduced by downscaling the arrangement of the gate electrodes 20, there may be a case where the total ON-resistance cannot be reduced sufficiently. Further, it is difficult to form the contact structure to electrically connect the source electrode 50 to the p-type diffusion layer 15.

In contrast, in the semiconductor device 1 according to the embodiment, the gate electrode 20 extends in the gate trench GT without branching. When downscaling the gate trench GT, it is possible to mitigate the reduction of the surface areas positioned between the first portions 20a and between the second portions 20b in the semiconductor body 10. In other words, it is possible to suppress the ON-resistance increasing in the n-type drift layer 11. Also, the contact trench CT is easily formed between the first portions 20a and between the second portions 20b, and thus, it is easy to form the contact structure in which the source electrode 50 contacts the p-type diffusion layer 15.

Figure 2A:
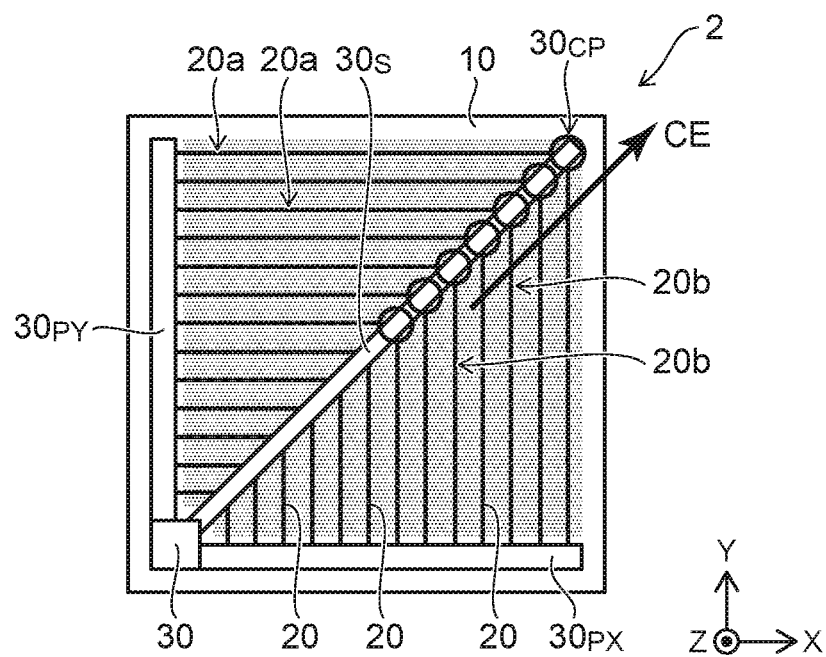
FIGS. 2A and 2B are schematic views showing a semiconductor device according to a modification of the embodiment.
Figure 2B:
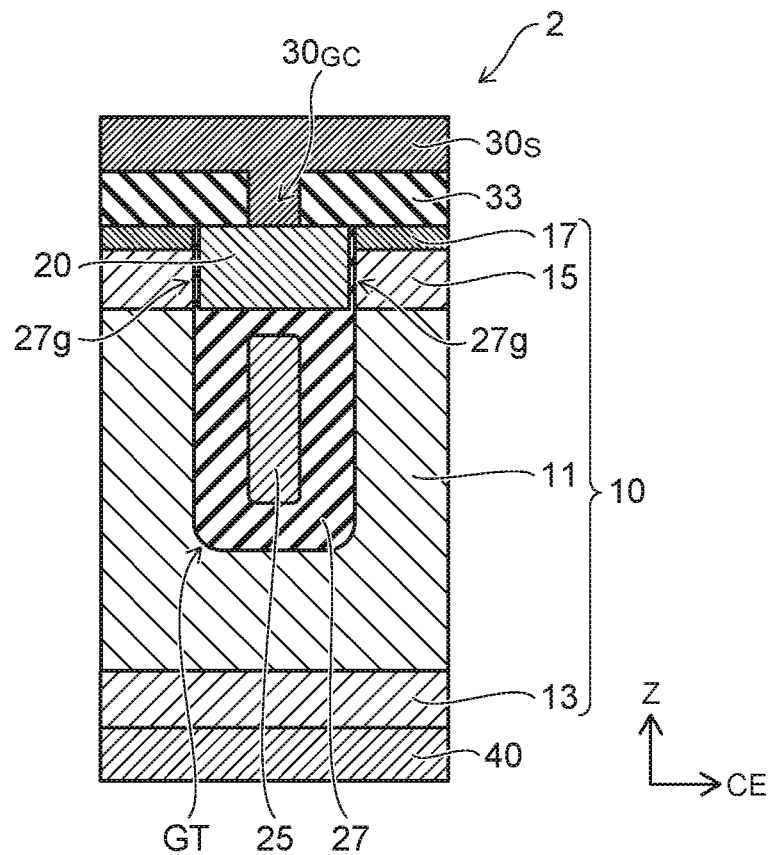

FIGS. 2A and 2B are schematic views showing a semiconductor device 2 according to a modification of the embodiment. FIG. 2A is a schematic plan view showing the arrangement of the gate electrodes 20, the gate pad 30, and the gate interconnects $30_{PX}$, $30_{PY}$, and $30_S$. FIG. 2B is a schematic cross-sectional view along the direction CE shown in FIG. 2A.

In the semiconductor device 2, as shown in FIG. 2A, the gate interconnect $30_S$ is provided to be positioned above the connection portions of the first portions 20a and the second portions 20b of the gate electrodes 20. The gate interconnect $30_S$ extends along the direction CE from the gate pad 30, and is positioned above the connection portions of the multiple gate electrodes 20.

FIG. 2B is a cross-sectional view of a contact portion $30_{CP}$ shown in FIG. 2A. The gate interconnect $30_S$ is provided above the semiconductor body 10. The gate interconnect $30_S$ is electrically insulated from the semiconductor body 10 by the inter-layer insulating film 33. The gate interconnect $30_S$ is electrically connected to the gate electrodes 20 via gate contacts $30_{GC}$. The gate contacts $30_{GC}$ extend through the inter-layer insulating film 33 from the gate interconnect $30_S$ with a depth capable of reaching the gate electrodes 20.

The gate contact $30_{GC}$ is provided to reduce the parasitic resistances of the gate electrodes 20. For example, each gate electrode 20 has a parasitic resistance between the connection portion of each gate electrodes 20 and the gate interconnect $30_{PX}$ and the connection portion of each gate electrodes 20 and the gate interconnect $30_{PY}$. Thus, the gate contacts $30_{GC}$ are provided, for example, when at least one gate electrode 20 has the parasitic resistance greater than a prescribed value. Thereby, it is possible in the semiconductor device 2 to improve the response speed for the gate bias.

Figure 3A:
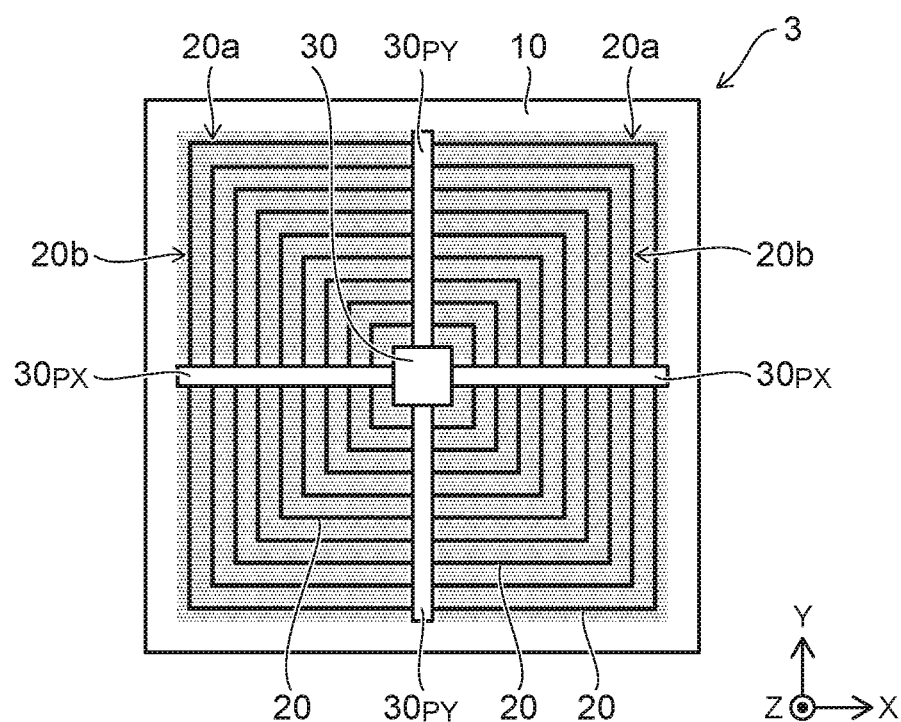
FIGS. 3A and 3B are schematic views showing a semiconductor device according to another modification of the embodiment.
Figure 3B:
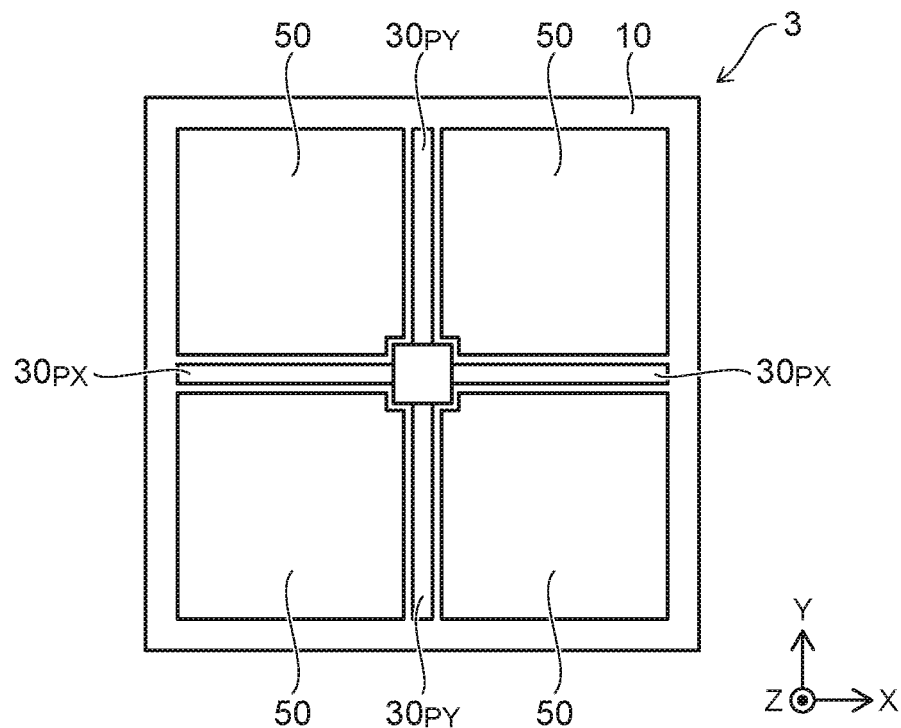

FIGS. 3A and 3B are schematic views showing a semiconductor device 3 according to a modification of the embodiment. FIG. 3A is a schematic plan view showing the arrangement of the gate electrodes 20, the gate pad 30, and the gate interconnects $30_{PX}$ and $30_{PY}$. FIG. 3B is a schematic plan view showing the arrangement of the gate pad 30, the gate interconnects $30_{PX}$ and $30_{PY}$, and the source electrode 50.

In the semiconductor device 3, as shown in FIG. 3A, the gate pad 30 is placed at the center of the active region. The gate interconnect $30_{PX}$ extends in the +X direction and the −X direction from the gate pad 30. The gate interconnect $30_{PX}$ is electrically connected to the gate pad 30. The gate interconnect $30_{PY}$ extends in the +Y direction and the −Y direction from the gate pad 30. The gate interconnect $30_{PY}$ is electrically connected to the gate pad 30.

The semiconductor device 3 includes the multiple gate electrodes 20. The gate electrodes 20 each include the first portion 20a and the second portion 20b. The first portions 20a are electrically connected to the gate interconnect $30_{PY}$ and extend in the X-direction. The second portions 20b are connected to the gate interconnect $30_{PX}$ and extend in the Y-direction. The first portions 20a of the multiple gate electrodes 20 are arranged in the Y-direction; and the second portions 20b are arranged in the X-direction.

For example, comparing the gate electrodes 20 disposed at the same position on the front surface of the semiconductor body 10, the gate electrodes 20 in the semiconductor device 3 each have the length between the connection portion at the gate interconnect $30_{PX}$ and the connection portion at the gate interconnect $30_{PY}$ that is shorter than that of the gate electrodes 20 in the semiconductor device 1. That is, in the semiconductor device 3, the parasitic resistances of the gate electrodes 20 are reduced; and the response speed for the gate bias can be faster.

As shown in FIG. 3B, the source electrode 50 is divided into four portions that do not overlap the gate pad 30 and the gate interconnects $30_{PX}$ and $30_{PY}$. Because the source electrode 50 is placed on the front surface of the semiconductor body 10 such that the four portions are spaced away from each other, the source electrode 50 is electrically insulated from the gate pad 30 and the gate interconnects $30_{PX}$ and $30_{PY}$. The embodiment is not limited to the example; for example, the source electrode 50 may be positioned on the gate interconnects $30_{PX}$ and $30_{PY}$ with an inter-layer insulating film interposed.

FIG. 4A to FIG. 5B are schematic views showing semiconductor devices 4 to 7 according to modifications of the embodiment. FIG. 4A to FIG. 5B are schematic views showing the arrangement of the gate electrode 20 and the gate pad 30.

Figure 4A:
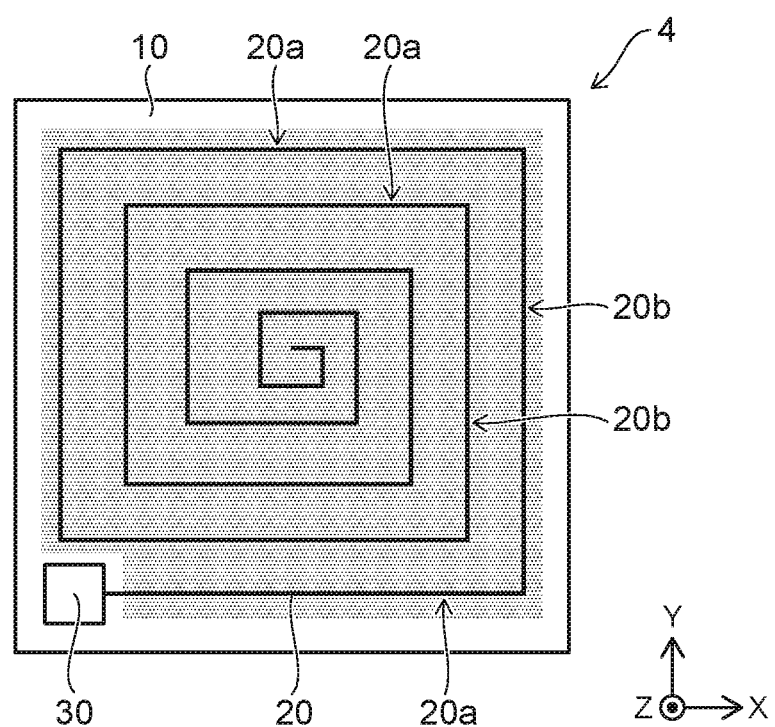
FIGS. 4A and 4B are schematic views showing a semiconductor device according to yet another modification of the embodiment.

In the semiconductor device 4 shown in FIG. 4A, the gate electrode 20 has a planar configuration in which the multiple first portions 20a and the multiple second portions 20b are linked to be one body. For example, the gate electrode 20 is configured in a spiral configuration of the multiple first portions 20a and the multiple second portions 20b. The multiple first portions 20a are arranged in the Y-direction; and the multiple second portions 20b are arranged in the X-direction. The gate pad 30 is placed in one of the four corners positioned at the outer edge of the front surface of the semiconductor body 10; and the gate electrode 20 is electrically connected to the gate pad 30.

Figure 4B:
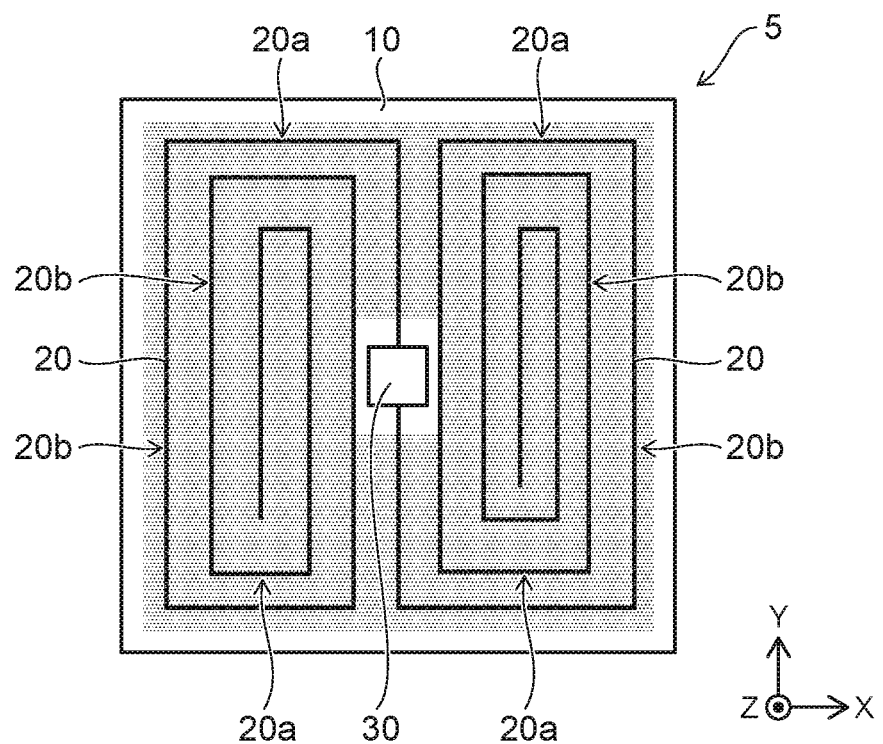

In the semiconductor device 5 shown in FIG. 4B, the gate pad 30 is placed on the center portion in the front surface of the semiconductor body 10; and two gate electrodes 20 are disposed on both sides of the gate pad 30. The two gate electrodes 20 each have a configuration in which the multiple first portions 20a and the multiple second portions 20b are disposed as one body in a spiral configuration. The multiple first portions 20a are arranged in the Y-direction; and the multiple second portions 20b are arranged in the X-direction. The gate electrodes 20 are electrically connected to the gate pad 30 at the center of the semiconductor body 10. The gate electrodes 20 may be symmetrically disposed with respect to the gate pad 30.

Figure 5A:
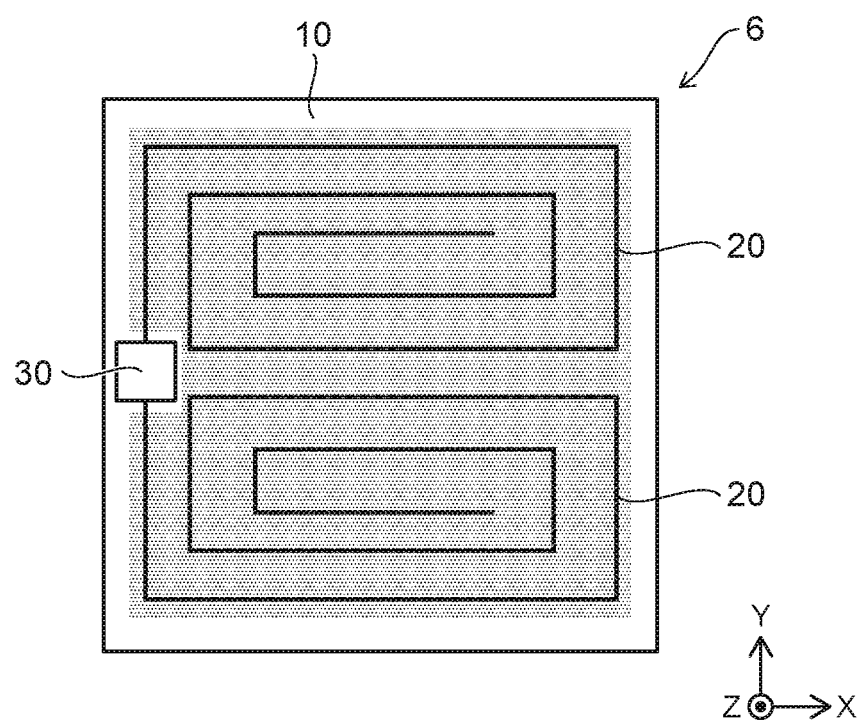
FIGS. 5A and 5B are schematic views showing a semiconductor device according to other modification of the embodiment.

The semiconductor device 6 shown in FIG. 5A has a structure in which two gate electrodes 20 are arranged in the Y-direction. The two gate electrodes 20 each have a configuration in which the multiple first portions 20a and the multiple second portions 20b are disposed as one body in a spiral configuration. The gate pad 30 is placed on the periphery in the front surface of the semiconductor body 10. The two gate electrodes 20 are electrically connected to the gate pad 30 at the outer edge of the semiconductor body 10. The gate electrodes 20 are disposed in line symmetry with respect to the gate pad 30.

Figure 5B:
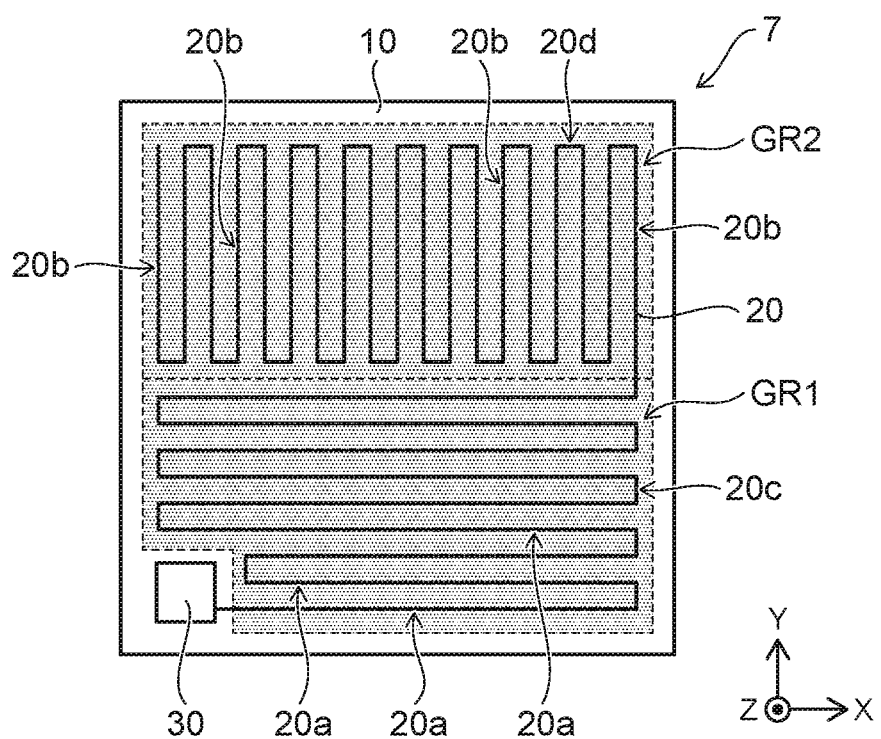

In the semiconductor device 7 shown in FIG. 5B, the gate electrode 20 includes the multiple first portions 20a, the multiple second portions 20b, multiple third portions 20c, and multiple fourth portions 20d. The gate electrode 20 has a configuration in which the multiple first portions 20a and the multiple second portions 20b are linked in one body via the third portions 20c and the fourth portions 20d. For example, the third portions 20c extend in a direction (e.g., the Y-direction) crossing the first portions 20a. For example, the fourth portions 20d extend in a direction (e.g., the X-direction) crossing the second portions 20b. The gate electrode 20 is electrically connected to the gate pad 30 placed at one of the four corners along the outer edge of the front surface of the semiconductor body 10.

The multiple first portions 20a are disposed in the first region GR1 and connected to each other via the third portions 20c. The multiple second portions 20b are disposed in the second region GR2 and connected to each other via the fourth portions 20d. The first region GR1 and the second region GR2 are arranged in the Y-direction in the front surface of the semiconductor body 10. The multiple first portions 20a are arranged in the Y-direction; and the multiple second portions 20b are arranged in the X-direction. The multiple third portions 20c and the multiple fourth portions 20d also contribute to the warp reduction of the wafer.

As the semiconductor devices 4 to 7 include the multiple first portions 20a and the multiple second portions 20b, the warp of the wafer can be effectively suppressed in the manufacturing processes. By further linking the multiple first portions 20a and the multiple second portions 20b as one body, the front surface area of the semiconductor body 10 can be used effectively to reduce the ON-current. In the semiconductor devices 4 to 7 as well, the parasitic resistance of the gate electrode 20 can be reduced by appropriately providing the gate interconnect $30_S$ and the contact portion $30_{CP}$.

Figure 6A:
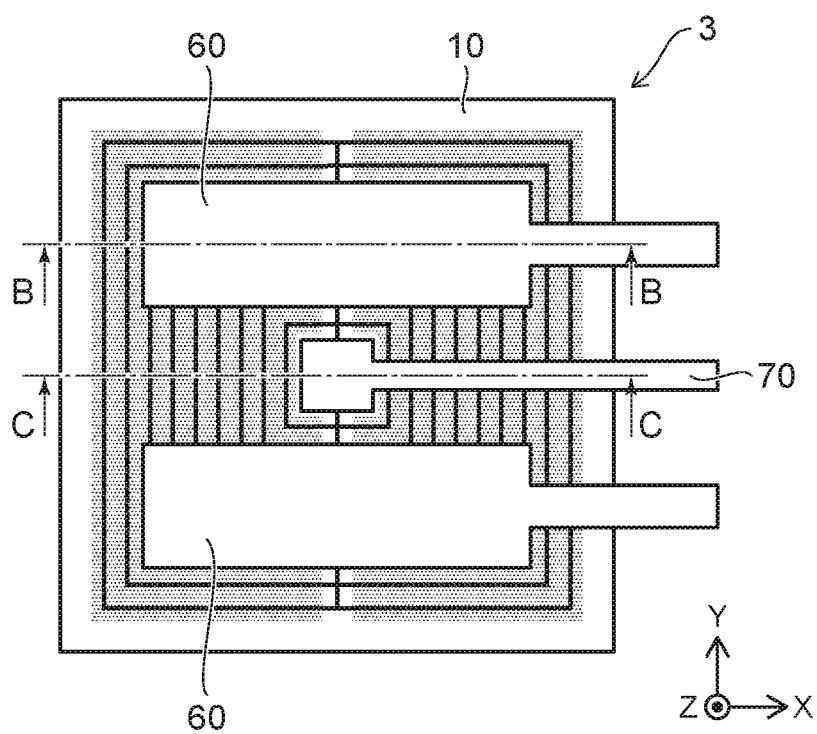
FIGS. 6A to 6C are schematic views showing a method for mounting the semiconductor device according to the embodiment.
Figure 6B:
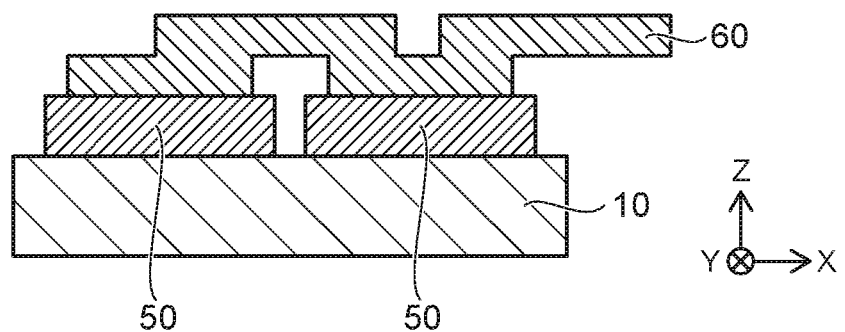
Figure 6C:
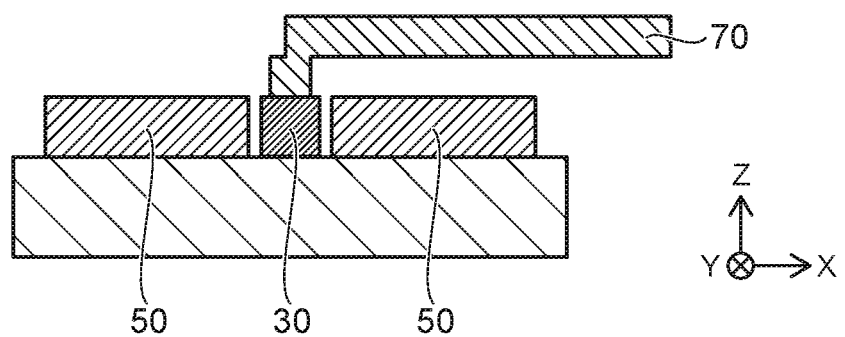

FIGS. 6A to 6C are schematic views showing a method for mounting the semiconductor device 3 or the semiconductor device 5 according to the embodiment (referring to FIG. 4B). In the semiconductor devices 3 and 5, the gate pad 30 is placed at the center of the front surface of the semiconductor body 10.

FIG. 6A is a schematic plan view showing the arrangement of connectors 60 and 70 provided above the semiconductor body 10 of the semiconductor device 3. FIG. 6B is a schematic view showing a cross section along the line B-B shown in FIG. 6A. FIG. 6C is a schematic view showing a cross section along the line C-C shown in FIG. 6A. The source electrode 50 is not illustrated in FIG. 6A; and the semiconductor layers of the semiconductor body 10, the gate electrode 20, and the drain electrode 40 are not illustrated in FIGS. 6B and 6C.

As shown in FIG. 6A, for example, the two connectors 60 and the connector 70 are disposed above the semiconductor body 10. For example, the connectors 60 are connected to a ground potential. For example, the connector 70 is connected to a circuit for supplying the gate bias.

As shown in FIG. 6B, the connector 60 is connected to the source electrode 50. The drain electrode 40 (referring to FIG. 1B) is connected to, for example, a circuit for supplying the drain bias. Thereby, a prescribed voltage is supplied between the drain-source electrodes.

As shown in FIG. 6C, for example, the connector 70 straddles the source electrode 50 and is connected to the gate pad 30. The connector 70 is provided above the source electrode 50, and is spaced away from the source electrode 50. In the example, as the connector 70 is connected to the gate pad 30 positioned at the center of the semiconductor body 10, the connectors 60 are provided on both sides of the connector 70.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor device, comprising:
a semiconductor body including a first semiconductor layer of a first conductivity type;
a first electrode provided on a back surface of the semiconductor body;
a second electrode provided on a front surface side of the semiconductor body;
a third electrode provided on the front surface side of the semiconductor body and electrically insulated from the semiconductor body and the second electrode;
a plurality of control electrodes each disposed inside a trench on the front surface side of the semiconductor body, the control electrodes being placed between the semiconductor body and the second electrode,
the control electrodes being electrically connected to the third electrode, the control electrodes each being electrically insulated from the semiconductor body by a first insulating film, and electrically insulated from the second electrode by a second insulating film,
the control electrodes each continuously extending inside the trench without branching,
the control electrodes include a plurality of first portions and a plurality of second portions, the first portions each extending in a first direction parallel to the front surface of the semiconductor body, the second portions each extending in a second direction parallel to the front surface of the semiconductor body, the second direction crossing the first direction,
the first portions being arranged along a third direction orthogonal to the first direction, the third direction being parallel to the front surface of the semiconductor body, the second portions being arranged along a fourth direction orthogonal to the second direction, the fourth direction being parallel to the front surface of the semiconductor body;
a first control interconnect extending in the third direction, the first control interconnect being electrically connected to the third electrode and the first portions of the control electrodes; and
a second control interconnect extending in the fourth direction, the second control interconnect being electrically connected to the third electrode and the second portions of the control electrodes, the semiconductor body further including a second semiconductor layer of a second conductivity type and a third semiconductor layer of the first conductivity type, the second semiconductor layer being provided between the first semiconductor layer and the second electrode, the second semiconductor layer opposing the control electrodes with the first insulating film interposed, the third semiconductor layer being selectively provided between the second semiconductor layer and the second electrode, the third semiconductor layer being electrically connected to the second electrode.

2. The device according to claim 1, wherein the third electrode is placed at a center of the front surface of the semiconductor body.

3. The device according to claim 1, further comprising:
a third control interconnect extending along the front surface of the semiconductor body, the third control interconnect including a portion positioned above a connection portion of a first portion and a second portion of the one of the plurality of control electrodes, the third control interconnect being electrically connected to the one of the plurality of control electrodes at the connection portion.

4. The device according to claim 1, further comprising:
a field plate provided inside the trench, the field plate being positioned between one of the control electrodes and the first electrode, the field plate extending along the one of the control electrodes and being electrically connected to the second electrode.

5. A semiconductor device, comprising:
a semiconductor body including a first semiconductor layer of a first conductivity type;
a first electrode provided on a back surface of the semiconductor body;
a second electrode provided on a front surface side of the semiconductor body;
a third electrode provided on the front surface side of the semiconductor body and electrically insulated from the semiconductor body and the second electrode; and
a control electrode disposed inside a trench on the front surface side of the semiconductor body, the control electrode being placed between the semiconductor body and the second electrode, the control electrode being electrically connected to the third electrode, the control electrode being electrically insulated from the semiconductor body by a first insulating film, and electrically insulated from the second electrode by a second insulating film, the semiconductor body further including a second semiconductor layer of a second conductivity type and a third semiconductor layer of the first conductivity type, the second semiconductor layer being provided between the first semiconductor layer and the second electrode, the second semiconductor layer opposing the control electrode with the first insulating film interposed, the third semiconductor layer being selectively provided between the second semiconductor layer and the second electrode, the third semiconductor layer being electrically connected to the second electrode, the control electrode continuously extending inside the trench without branching, the control electrode including a plurality of first portions, a plurality of second portions, a plurality of third portions and a plurality of fourth portions, the first portions each extending in a first direction parallel to the front surface of the semiconductor body, the second portions each extending in a second direction parallel to the front surface of the semiconductor body, the second direction crossing the first direction, the third portions extending in the second direction, the fourth portions extending in the first direction, wherein the front surface of the semiconductor body includes a first region and a second region adjacent to the first region, the first portions and the third portions being placed in the first region, the first portions continuously extending via the third portions, respectively, the second portions and fourth portions being placed in the second region, the second portions continuously extending via the fourth portions, respectively, and the first to fourth portions are linked to be one body.

* * * * *